US005240510A

United States Patent [19]
Goldade et al.

[11] Patent Number: 5,240,510
[45] Date of Patent: Aug. 31, 1993

[54] PHOTOVOLTAIC CELL

[75] Inventors: Victor A. Goldade; Evgeny M. Markov; Lenoid S. Pinchuk, all of Gomel, U.S.S.R.; Vladimir N. Kestelman, Pennsauken, N.J.; Andrey M. Girin, Moscow, U.S.S.R.

[73] Assignee: Development Products Inc., Pennsauken, N.J.

[21] Appl. No.: 764,311

[22] Filed: Sep. 23, 1991

[51] Int. Cl.⁵ .................. H01L 31/06; H01L 31/0344
[52] U.S. Cl. .................................... 136/259; 136/255; 136/256; 136/263
[58] Field of Search ............... 136/256, 259, 255, 263; 250/211 R, 211 J, 212; 357/4, 12, 30 D, 30 J, 30 M, 30 Q

[56] References Cited
U.S. PATENT DOCUMENTS 3,676,688 7/1972 Sharples .......................... 250/211 R
3,935,031 1/1976 Adler ................................. 136/264

FOREIGN PATENT DOCUMENTS 52-17827 2/1977 Japan .................................. 136/263

Primary Examiner—Aaron Weisstuch

[57] ABSTRACT

A solar cell having an active zone made of a polar polymeric film material is disclosed. The electric contacts on the surfaces of the active zone are made of metals differing in electrochemical potentials. At least one of the electric contacts has a coating that absorbs solar radiation. The absorbent coating is preferably applied to the electric contact in the form of a polymeric material whose shape approximates a hemisphere. The active zone surface and the electric contact surface free of hemispherical portions are provided with an absorbent coating made of a material whose absorbing capability is different from that of the material of the hemispherical portions.

6 Claims, 1 Drawing Sheet

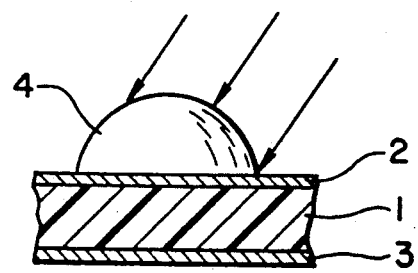
FIG. 1
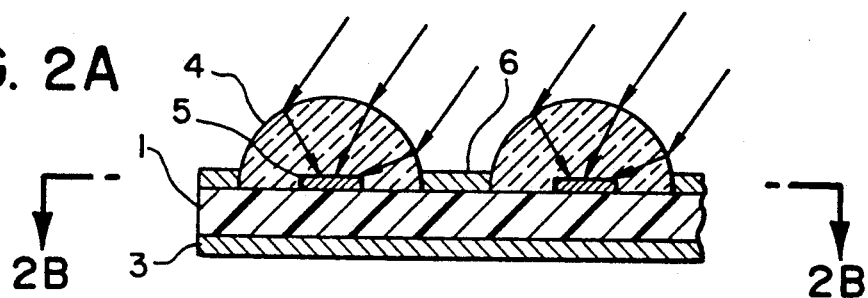
FIG. 2A
FIG. 2B
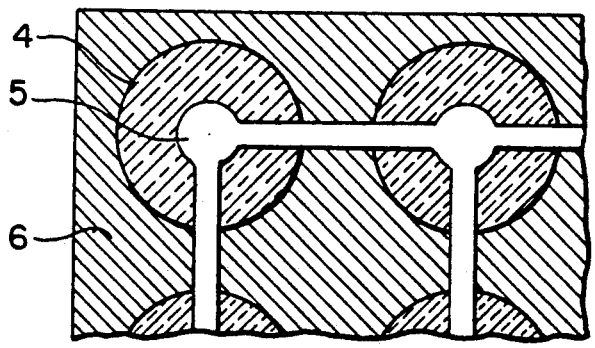
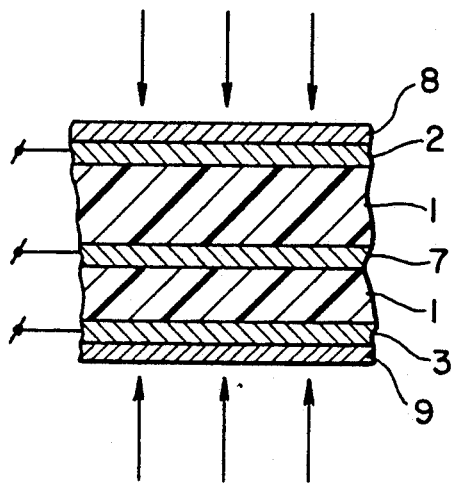
FIG. 3
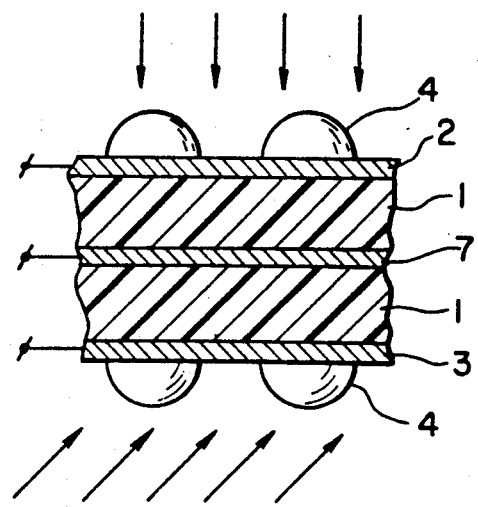
FIG. 4

PHOTOVOLTAIC CELL

BACKGROUND OF THE INVENTION

This invention relates to photoelectric converters and to large-area solar cells having a compact form.

One known solar cell is made from a single-crystal plate of lithium niobiate whose opposite surfaces carry applied electrodes made from the same metal. In such a cell, the lithium niobiate crystal (active zone) is used as a converter of the energy of solar radiation photons falling on one of the electrodes into charge carriers which are stored with the aid of an electrical energy capacitor-type accumulator. It is known that the amount of charge carriers in the active zone (semiconductor plate), may be increased if the plate surface facing the radiation source is covered with a current-conducting film made of tin oxide; applied atop the film is a coating made of cadmium sulfide containing indium. The metal electrodes are provided on the cadmium-sulfide coating and on the opposite surface of the semiconductor plate. Thus, applied to the opposing surfaces of the plate are electrodes which have different electrochemical potentials which significantly add to the amount of the charge carriers dislodged by the photons of incident radiation. A disadvantage of this structure is that the rigid semiconductor plate does not permit manufacture of a compact solar cell having a low cost, large dimension of radiation-absorbent surface, and low weight.

Another known semiconductor device used for converting light energy into electrical energy has an active zone made of hydrogenated amorphous silicon with heterogeneous electrodes applied to the opposing surfaces and an absorbing coating is applied on the solar-radiation incident surface. Though such a device is more effective to convert the energy and is inexpensive to manufacture, it has the disadvantages typical of the above described solar cells. A solar cell made of hydrogenated amorphous silicon applied on a polyethyleneterephthalate flexible ribbon is known, which makes it possible to create flexible structures of the solar cell but does not reduce its cost.

Still another solar cell was developed which has an active zone made of semiconductor material which is coated on both sides with oxide layers provided with holes. On the side where the solar rays are incident, the holes are provided with metal contacts and the holes serve as the concentrators of radiation. The presence of holes increases the effectiveness of the energy conversion and attributes to lessening of the cell weight; however, the use of semiconductor material as the active zone material increases the cost of the solar cell and makes it impossible to create a large-area converter which, when in transit, has a compact form and small dimensions.

SUMMARY OF THE INVENTION

An object of this invention is to reduce the cost of photovoltaic devices and to expand their functional capabilities. This object is attained by the construction of a solar cell having an active zone made of a polar polymeric film material. The electric contacts on the surfaces of the active zone are made of metals differing in electrochemical potentials. At least one of the electric contacts has a coating that absorbs solar radiation. The absorbent coating is preferably applied to the electric contact in the form of a polymeric material whose shape approximates a hemisphere. The active zone surface and the electric contact surface free of hemispherical portions are provided with an absorbent coating made of a material whose absorbing capability is different from that of the material of the hemispherical portions.

BRIEF DESCRIPTION OF THE DRAWINGS

FIG. 1 is a structural diagram of the claimed solar cell illustrating the absorption of radiation by the hemispherical portion of the coating.

FIG. 2A illustrates a solar cell, in cross-section, whose electrode is made in the form of mesh.

FIG. 2B is a plan view of the solar cell of FIG. 2A along the line B–B'.

FIGS. 3 and 4 show examples of solar cells having active zones made of two films with a metal electrode arranged between them.

DETAILED DESCRIPTION OF THE INVENTION

In its simplest form, the photovoltaic cell of the present invention has an active zone formed from a polar polymeric film material. On the surfaces of the active zone, as its electrical contacts, the cell has two different metals having different electrochemical potentials. The electrochemical potential difference is at least 0.8 volts, and preferably larger. In general, the electrochemical potential of the contact which receives incident radiation is less than the electrochemical potential of the metal forming the contact remote from the incident radiation. In a preferred embodiment of the invention, the irradiated contact is provided with a radiation-absorbent coating of a nonpolar polymeric material. Preferably, the absorbent coating is applied to the metal portions of the irradiated electrical contact in the form of hemispheres adapted to focus and/or concentrate absorbed radiation on the metal portions. The hemispheres are held to the cell surface and the spaces between adjacent hemispheres are covered by a suitable absorbent coating material of different composition than the materials of the hemispheres so as to not interfere with the focusing and/or concentrating effect. Typically, this material could be an epoxy resin.

In a preferred embodiment, the electrical contact facing the radiation is constructed in the form of a mesh. The cross-over points of the mesh are generally somewhat enlarged as centers of radiation absorption. All of the portions of the net are covered by the absorbent coating as described previously.

In a somewhat different embodiment of the invention, the photovoltaic cell comprises two active zones, each made of the polar polymeric film material as described previously. Between these two active zones is a metal electrode mesh as described. The outside of each of the active zones is provided with a metal contact as described previously. In this arrangement, the electrochemical potential of the central electrode is preferably more positive than the potentials of the electric contacts.

From the foregoing, it may be seen therefore that the objects are also attained using electric contacts made of metals having a difference of electrochemical potentials of at least 0.8 V. Particularly good results are attained when the film material comprises two polymeric films and the metal mesh electrode positioned between these films, and the electrochemical potentials of the metals of the electric contacts and the electrode have the following relationship:

$$\phi_{con.1} \leq \phi_{el.} \leq \phi_{con.2},$$

where $\phi_{con.1}$ and $\phi_{con.2}$ are the electrochemical potentials of the contacts, and $\phi_{el.}$ is the electrochemical potential of the mesh electrode. In addition to that, the object is attained by the fact that the metal electrode positioned between two layers of film material is made of a metal having a more positive electrochemical potential than the potentials of the metals of the outer electric contacts.

Manufacturing the active zone from polar polymeric material greatly reduces the mass and cost of the solar cell as compared with cells made on the basis of semiconductor elements. Application of the absorbent coating in the form of portions of polymeric material secured on the surface of the receiving electrode and their hemispherical form makes it possible to increase the effective absorbent surface, to concentrate the solar radiation on the surface of the electrode occupied by a hemispherical portion and thus to increase the effectiveness of converting the radiation while decreasing the area occupied by the absorbent coating, to retain the cell flexibility and to convert radiation incident at small angles.

Manufacturing the electric contact in the form of mesh and applying the hemispherical portions of absorbent coating to the intersections of this mesh contribute to the reduction of the cell mass. Application of the additional absorbent coating of material whose absorption differs from that of the material of the hemispherical portion to the surface free of hemispherical portions makes it possible to more effectively use the entire spectrum of the incident radiation. The use of metals whose difference of electrochemical potentials is 0.8 V contributes to an increase of the current characteristics of the cell. Introduction of the metal electrode into the cell active zone, its arrangement between two polymeric films and manufacturing of the contacts and electrode using metals whose electrochemical potentials are arranged in increasing order of magnitude additionally increase the current characteristics and make it possible to use this electrode as a control electrode. Manufacturing the electrode from metal whose electrochemical potential is more positive than the potentials of the contacts expands the capabilities of the cell when it is used as double-sided solar cell.

In accordance with the present invention, photovoltaic cells are formed in which the active zone is made of polar polymeric film; the absorbent coating applied to the electrode (on which radiation is incident) is made in the form of portions of polymeric material whose shape is close to spherical; the hemispherical portions of the absorbent material are arranged on the intersections of the mesh-type electric contact; additionally introduced into the active zone is a metal electrode whose electrochemical potential differs from the potentials of the electric contacts.

With reference to FIG. 1, the active zone in the photovoltaic cell comprises a film (1) made of a polar polymer. Applied to the film surfaces are the upper (2) and lower (3) electric contacts. Applied to the surface of the upper contact is an absorbent coating made in the form of hemispherical portions of nonpolar polymeric material (4) distributed over the contact surface and adhesively coupled to it. For the purpose of conserving metal, the upper contact may be made in mesh (see FIGS. 2A and 2B) and the hemispherical portions of the absorbent coating (4) are arranged on intersections (5) of this mesh; the electrode under the hemispherical portion will be a maximum area of the radiation surface. The surface of the active zone not occupied by the upper electrode is coated by material (6).

A solar cell with the active zone consisting of two films (1) and with the electrode (7) arranged between them is shown in FIG. 3. Absorbent coatings (8, 9) are applied to the electrodes (2 and 3). In another version (FIG. 4), the absorbent coating is applied in the form of hemispheric portions of polymeric material (4).

The solar cell operates as follows. The radiation is absorbed by the coating (4, 6, 8, 9). When the absorbent coating is made in the form of portions (4) of polymeric material whose shape is close to spherical (4), the radiation is collected from an area greater than that occupied by the portion of the coating, i.e., each portion operates as an immersion lens, and concentrates the radiation on the surface of contact (2). The light quanta act on the material of the upper contact (2) to cause the emission of the charged carriers which pass through the polymeric film (1) and reach the surface of the lower contact (3). Thus, when connecting the upper and lower contact to the measuring circuit, the electric field caused by the difference of standard electrochemical potentials of the metals of the contacts will result in the flowing of current. Accumulation of the energy of such a cell may be performed using a capacitor-type circuit.

Applied to the portions of the cell which are free of absorbent coating (4) are coatings (6) which operate when the spectrum of radiation is changed.

When using the cell shown in FIG. 3, if the electrochemical potentials of the metal of mesh electrode (7) and the contacts (2, 3) are arranged in ascending order, i.e., $\phi_{con.1} \leq \mu \phi_{el.} \leq \mu \phi_{con.2}$, there is caused a "pulling field" effect, when the carriers are displaced from one contact to the electrode and therefrom to the other contact owing to the difference of electrochemical potentials. Application of additional difference of the potentials to the middle electrode increases the current in the circuit. When a metal having a more positive electrical potential as compared with that of the upper and lower contact is arranged between the two films (1), the cell operates both when absorbing radiation on the side of the upper electrode and on the side of the lower electrode.

To check the operability of the claimed solar cell, there were manufactured samples of cells whose active zones were made on the basis of films of the following polymers: polyethyleneterephthalate (PETPH), polypropylene (PP), polyimide (PM), polypentene (PT), polyvinylbutyral (PVB). The thickness of the films was from 5 to 20 $\leq$. To the surfaces of the films, there were applied, in vacuum, coatings of the following metals: aluminum, magnesium, nickel, lead, copper, silver. The terminals of a suitable meter were connected to portions of the upper and lower contacts. The solar element was irradiated by a halogen lamp placed at a distance of 80 mm. from the solar cell surface. Controlling the lamp radiation by means of a voltage regulator allowed the incident radiation intensity to be varied from 18.4 to 101.2 W. cm.$^{-2}$.

It was established that the samples of the cells with polar polymers (PETPH, PM, PT, PVB) are operable, i.e., irradiated the cells change their current value as compared with their dark current by a factor of $10^2$, $10^3$, while the current in the cells with nonpolar polymers failed to increase and remained comparable with the dark current.

The use of the portions of polymeric material as the absorbent coating, whose shape is close to spherical has made it possible to improve the characteristics of the claimed cell with the flexibility of the films retained. In particular, a coating applied in portions (see Table 1) occupying only 50% of the area of the illuminated contact makes it possible to increase the charge accumulated by the capacitor circuit approximately by an order of magnitude without deteriorating the cell flexibility. Applying a continuous coating of carbon black is not wise from the point of view of technology, while a continuous coating made of powdered epoxy paint lessens the cell flexibility. The hemispherical shape of the portions of the coating facilitates the collection of radiation falling on the surface of the illuminated contact at different angles. So, the use of hemispherical portions occupying 50% of the illuminated area is equal to application of a continuous coating to the entire illuminated area. Lessening of the cell mass is also achieved by the use of the electrodes in the form of a mesh to which the portions of the coating are applied. This makes it possible to reduce the expenditure of metal in the manufacture of the electrode 3 to 5 times. When using additional absorbent coating materials whose absorption capability differs from that of the portion of the coating, this allows s wider spectrum of incident radiation to be used, i.e., to expand the range of the cell operation.

TABLE 1

Accumulation of charge by a capacitor for certain periods of time for the Cu-PETPH-Al sample when illuminated on the side of copper

| Absorbent material | Voltage across capacitor, V, for a period of: | | | |
|---|---|---|---|---|
| | 15 min. | 30 min. | 45 min. | 60 min. |
| Copper without coating | 0.010 | 0.020 | 0.025 | 0.040 |
| Copper coated with carbon black | 0.041 | 0.068 | 0.067 | 0.105 |
| Portions of copper coated using epoxy powder (50% of the copper area) | 0.160 | 0.245 | 0.320 | 0.350 |

Manufacturing the contacts from different metals and measuring the currents with one of the electrodes being illuminated have made it possible to establish the differential range of the metal potentials at which the currents of the claimed solar cell are at a maximum (see Table 2). Proceeding from the data specified in Table 2, there was plotted the relationship between the current and the difference of potentials and proceeding from the condition that the current is two times as large as the minimum current, there was established that large currents flow at a difference of potentials of $\geq 0.8$ V.

Manufacturing the cells from two polymeric films with a metal electrode arranged between them and with application of such metals to the external surfaces of the polymeric films such that their electrochemical potentials are arranged in ascending order have brought about an increase of the current flowing in the cell. Given as an example in Table 3 are the values of the current for the Mg-PETPH-Al and Mg-PETPH-Al-PETPH-Cu samples. It is obvious that such an arrangement brings about an increase of the current in the claimed cell.

TABLE 2

Relationship between the currents flowing in the sample and the difference of electrode potentials of the contact metals (Sample: metal 1-PETPH-metal 2, illumination - 88.3 W.cm.$^{-2}$)

| Contacts | | Difference of potentials, V | Current, A |
|---|---|---|---|
| Measuring | Illuminated | | |
| Aluminum | Aluminum | 0. | $40 \times 10^{-11}$ |
| " | Magnesium | 0.70 | $51 \times 10^{-11}$ |
| " | Nickel | 1.41 | $35 \times 10^{-8}$ |
| " | Lead | 1.53 | $42 \times 10^{-8}$ |
| " | Copper | 1.99 | $45 \times 10^{-10}$ |
| " | Silver | 2.46 | $82 \times 10^{-11}$ |
| Aluminum | Aluminum | 0. | $9 \times 10^{-11}$ |
| Magnesium | " | 0.70 | $20 \times 10^{-11}$ |
| Nickel | " | 1.41 | $6 \times 10^{-11}$ |
| Lead | " | 1.53 | $52 \times 10^{-11}$ |
| Copper | " | 1.99 | $25 \times 10^{-11}$ |
| Silver | " | 2.46 | $21 \times 10^{-11}$ |

Manufacturing of the middle electrode from a metal whose potential is greater than the potentials of the outer electric contacts makes it possible to use the claimed cell as a solar cell with double-sided illumination, which extends the capabilities of the claimed cell.

In the cells provided with the middle electrode, it is possible to apply a bias voltage ($U_{bias}$) to this electrode. It was established that a positive value of the voltage contributes an increase of the current in the system (see Table 4). It is not obligatory that the potentials of the outer metals differ; they may be equal.

TABLE 3

Relationship between the current flowing in the sample and the intensity of radiation (illumination on the side of Mg.)

| Sample | Current (A) at radiation intensity (W · cm$^{-2}$) of: | | | | | | |
|---|---|---|---|---|---|---|---|
| | 18.4 | 27.6 | 38.6 | 51.5 | 69.5 | 88.3 | 101.2 |
| Mg-PETPH-Al | $0.22 \times 10^{-11}$ | $0.30 \times 10^{-11}$ | $0.52 \times 10^{-11}$ | $0.73 \times 10^{-11}$ | $0.12 \times 10^{-10}$ | $0.7 \times 10^{-10}$ | $0.20 \times 10^{-9}$ |
| Mg-PETPH-Al-PETPH-Cu | $0.52 \times 10^{-12}$ | $0.55 \times 10^{-12}$ | $0.83 \times 10^{-12}$ | $0.60 \times 10^{-11}$ | $0.63 \times 10^{-10}$ | $0.68 \times 10^{-9}$ | $0.35 \times 10^{-8}$ |

TABLE 4

Relationship between the current and bias voltage applied to the middle electrode (for the Mg-PETPH-Al-PETPH-Cu sample when illuminated on the side of Mg)

| $U_{bias}$, V | Current, $10^{-9}$ A |
|---|---|
| 1 | 7.5 |
| 2 | 9.2 |
| 3 | 11.5 |
| 4 | 16.1 |
| 5 | 19.3 |

Thus, the operability of the claimed cell is ascertained and it is shown that its capabilities are wider than those of the prior art devices. Manufacturing of the claimed cell from the polymeric films reduces the cost of the cell as compared with cells based on semiconductor materials. This cell can be used together with other structures and devices. For example, a space antenna of large area manufactured from the PETPH film with the respective coatings on its surface may be simultaneously used as a solar cell and may accumulate the energy required for the operation of the switching circuits.

We claim:

1. A solar cell comprising an active zone in the form of film material, having on its opposing surfaces electric contacts made form metals which differ from one another in their electrochemical potentials by an amount $\geq 0.8$ V, and having a first solar-radiation absorbent coating applied to one of the contacts, characterized in that said active zone is made of polar polymeric material.

2. A solar cell comprising an active zone in the form of film material, having on its opposing surfaces electric contacts made form metals which differ from one another in their electrochemical potentials, and having a first solar-radiation absorbent coating applied to one of the contacts in the form of portions of polymeric material whose shape is approximately hemispherical, characterized in that said active zone is made of polar polymeric material.

3. The solar cell, according to claim 2, characterized int hath the contact, to which the absorbent coating is applied, is in the form of a mesh and the portions of the absorbent coating are applied to the intersections of this mesh.

4. The solar cell, according to claim 3, characterized in that the active zone surface and the electric contact surface which are free of said hemispherical portions are provided with a second absorbent coating made of a material whose absorption characteristic differs form that of the material of said hemispherical portions.

5. A solar cell comprising an active zone in the form of film material, having on its opposing surfaces electric contacts made form metals which differ from one another in their electrochemical potentials by an amount, and having a first solar-radiation absorbent coating applied to one of the contacts, characterized in that said active zone is made of polar polymeric material comprising two layers with a metal mesh electrode arranged between them, and the electrochemical potentials of the metal electric contacts and the mesh electrode have the following relationship:

$$\phi_{con.1} \leq \phi_{el.} \leq \phi_{con.2},$$

where $\phi_{con.1}$, $\phi_{con.2}$ are the potentials of the contacts; $\phi_{el.}$ is the metal mesh electrode.

6. A solar cell comprising an active zone in the form of film material, having on its opposing surfaces electric contacts made form metals which differ from one another in their electrochemical potentials by an amount, and having a first solar-radiation absorbent coating applied to one of the contacts, characterized in that to provide a cell capable of double-sided irradiation, said active zone is made of polar polymeric material which comprises two layers with a metal electrode arranged between them, and the electrochemical potential of the metal electrode is more positive than the potentials of the metal electric contacts.

* * * * *